United States Patent [19]
McCullough

[11] Patent Number: 5,966,202
[45] Date of Patent: Oct. 12, 1999

[54] ADJUSTABLE SLIT

[75] Inventor: Andrew W. McCullough, Newtown, Conn.

[73] Assignee: SVG Lithography Systems, Inc., Wilton, Conn.

[21] Appl. No.: 08/829,099

[22] Filed: Mar. 31, 1997

[51] Int. Cl.$^6$ .............................. G03B 27/54; G03B 27/42
[52] U.S. Cl. ................................................. 355/67; 355/53
[58] Field of Search ..................... 355/67, 71, 74, 355/93, 53, 121; 250/515.1, 519.1, 491.1

[56] References Cited

U.S. PATENT DOCUMENTS

| | | | |
|---|---|---|---|
| 4,017,162 | 4/1977 | Mills | 350/271 |
| 4,047,808 | 9/1977 | Bartlett | 350/271 |
| 4,509,290 | 4/1985 | Stanfield, Jr. | 49/92 |
| 4,516,852 | 5/1985 | Liu et al. | 356/121 |
| 4,769,667 | 9/1988 | Ishiguro et al. | 354/435 |
| 4,920,552 | 4/1990 | Hermens | 378/153 |
| 5,107,530 | 4/1992 | Allison | 378/160 |
| 5,469,905 | 11/1995 | McKinney et al. | 160/35 |
| 5,598,250 | 1/1997 | Bae | 355/67 |
| 5,635,999 | 6/1997 | O'brien et al. | 396/508 |

*Primary Examiner*—Safet Metjahic
*Assistant Examiner*—Hung Henry Nguyen
*Attorney, Agent, or Firm*—Fattibene & Fattibene; Paul A. Fattibene; Arthur T. Fattibene

[57] ABSTRACT

Blades pivotally attached together linked to push rods and inserted into an illumination energy or flux. The blades extend longitudinally along the length of a rectangular illumination field or slit used to image a reticle onto a photosensitive substrate. The push rods are coupled to a flexure or link pivotally connected to each end of a substantially rectangular blade. The corners of the rectangular blades have a radius providing a smooth transition between blades. A frame holds the push rods in place as the blades are moved into and out of the illumination energy or flux. The push rods may be adjusted by a screw or other equivalent devices or methods. The lateral or sideways forces resulting from the movement of the blades is compensated for by the flexures or links resulting in less stress being placed on the blades. Slots placed at pivot points in the blades may also be used to facilitate movement of the blades. The illumination energy of the rectangular illumination field or slot is adjusted to provide a uniform illumination energy. Also included is a method of adjusting the device to provide a predetermined exposure dose along the length of the illumination field as a function of line width.

19 Claims, 5 Drawing Sheets

ADJUSTABLE SLIT

FIELD OF THE INVENTION

The present invention relates generally to illuminating a reticle for use lithography as used in manufacturing semiconductor devices, and particularly to adjusting the illumination field for providing a uniform or desired exposure.

BACKGROUND OF THE INVENTION

In the process of semiconductor manufacturing, lithography or photolithography is typically used to project light through a reticle exposing a silicon wafer coated with photosensitive resist in select regions to define circuit elements. An illumination system has been used in step-and-scan photolithography equipment sold under the trademark Micrascan by SVG Lithography Systems, Inc. Wilton, Conn. In this photolithography equipment, the reticle and the wafer move with different speeds. The different speeds having a ratio equal to the magnification of the projection optics. A rectangular or slit field defined by the illumination system is scanned over the reticle and over the wafer. A vertical field delimiter frames the vertical field height, and horizontal framing blades frame the horizontal field width. It is desirable to have as uniform an exposure field as possible. The illumination level is the integral, in the scan direction, of the illumination on the wafer. Often the illumination is not uniform enough. To obtain a uniform exposure or a constant level of illumination from the top to bottom longitudinally along the rectangular exposed field, an adjustable slit is often required. In the past adjustable slits have been used that employed a line of nails or projections perpendicular to the illumination beam. Individual nails or projections would be pushed into the illumination beam to make more uniform the illumination level or energy. Additionally, metal strips placed at an angle to the illumination beam would be bent or warped by rods thereby adjusting and making more uniform the illumination level or energy. One type of compliant member or adjustable slit is disclosed in U.S. Pat. No. 4,516,852 entitled "Method and Apparatus for Measuring Intensity Variations in a Light Source", issuing to Liu et al on May 14, 1985. Therein disclosed is an arcuate slit that is adjusted with a deformable band. While these prior adjustable slit devices have been helpful in providing a more uniform illumination field the ever increasing demands placed on lithography in reducing feature size of semiconductor devices and increasing yield require an even more uniform illumination field.

SUMMARY OF THE INVENTION

The present invention is a device for adjusting a rectangular illumination field or slit for providing a uniform illumination field used in scanning lithography. A plurality of blades are coupled or linked together so as to form a movable edge along a length of the rectangular illumination field. The ends of each blade are attached by a pivot pin to a link. The link is attached by a pivot pin to a push rod. The link may be a rigid link or a flexure. The push rods are independently adjustable causing the blades to be controllably inserted into and out of the rectangular illumination field. The edge corners of the blades have a radius equal to the distance of the pivot pin to the edge of the blade. The present invention also includes a method of providing a predetermined exposure dose along the longitudinal length of the illumination filed depending upon the line width of a feature to be imaged.

Accordingly, it is an object of the present invention to make more uniform a rectangular illumination filed.

It is another object of the present invention to provide a constant illumination flux along a longitudinal length of the rectangular illumination field.

It is an advantage of the present invention that a smoothly continuous adjustment is made to the rectangular illumination field.

It is another advantage of the present invention that adjustments may easily be made to the rectangular illumination filed.

It is another advantage present invention that a constant line width to exposure ratio can be maintained improving system performance.

It is a feature of the present invention that blades are coupled together by pivots forming an adjustable edge.

It is another feature of the present invention that a link is used between the blade and a push rod.

These and other objects, advantages, and features will become more apparent in view of the following detailed description.

BREIF DESCRIPTION OF THE DRAWINGS

FIG. 1 pictorially illustrates the illumination profile of a rectangular illumination field and the application of the present invention.

FIG. 2 graphically illustrates illumination energy.

FIG. 3 schematically illustrates an embodiment of the present invention.

FIG. 4 schematically illustrates the movement of the blades of the present invention.

DETAILED DESCRIPTION OF THE PREFERED EMBODIMENTS

Figure 1:
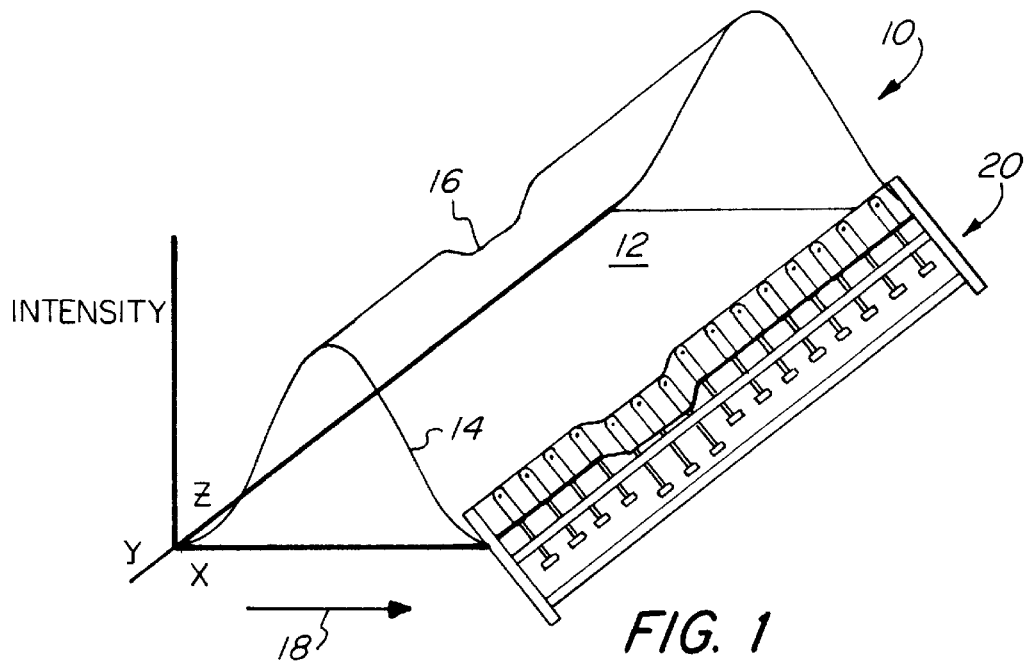

FIG. 1 illustrates an illumination profile 10 produced by an illumination system, not illustrated. The illumination system may be any illumination system used to illuminate a reticle, for example the illumination system disclosed in U.S. patent application Ser. No. 08/449,301 entitled "Hybrid Illumination System for Use in Photolithography", which is herein incorporated by reference. A rectangular illumination field or slit 12 is formed. The illumination field 12 has a length along the Y axis and a width along the X axis. Waveform 14 illustrates the intensity distribution along the X direction or width of the rectangular illumination field 12. The illumination profile 10 may have non-uniformities. Waveform 16 illustrates a nonuniformity. This non-uniformity may result in uneven exposure of a photosensitive resist covered substrate, such as a wafer which may result in poor quality or reduced yield. The present invention is illustrated generally as an adjustable slit device 20. The adjustable slit device 20 has a plurality of adjustable blades that are selectively inserted into the illumination profile 10 along a longitudinal length of the rectangular illumination field or slit 12. The illumination energy or flux of the rectangular illumination field is thereby adjusted correcting or making more uniform the illumination energy or flux along the longitudinal length of the rectangular illumination field. Therefore, when the rectangular illumination field 12 is scanned in the X direction, indicated by arrow 18, a desired more uniform exposure is obtained.

Figure 2:
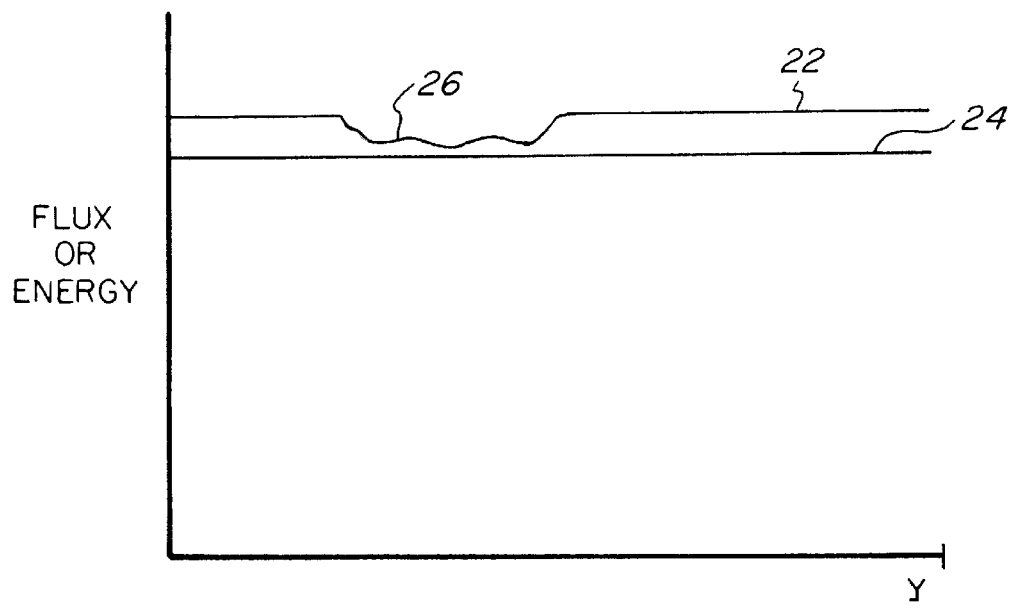

FIG. 2 graphically illustrates the improved more uniform illumination energy or flux achievable with the present invention. In FIG. 2, waveform 22 illustrates the total or integral of the uncorrected illumination energy or flux along the width of the rectangular illumination field, illustrated in FIG. 1, along the Y axis or longitudinal direction. Portion 26 of wafeform 22 illustrates the reduced illumination energy or flux as a result of the non-uniformity 16, illustrated in FIG. 1. Waveform 24 illustrates the more uniform illumination energy or flux as a result of inserting selected blades of the adjustable slit device 20, illustrated in FIG. 1, into the illumination profile 10. It should be noted that the energy level or flux along the Y direction or longitudinal length of the rectangular illumination filed or slit 12, illustrated in FIG. 1, is more constant or uniform. This results in a desirable more uniform exposure of a photosensitive resist covered substrate.

Figure 3:
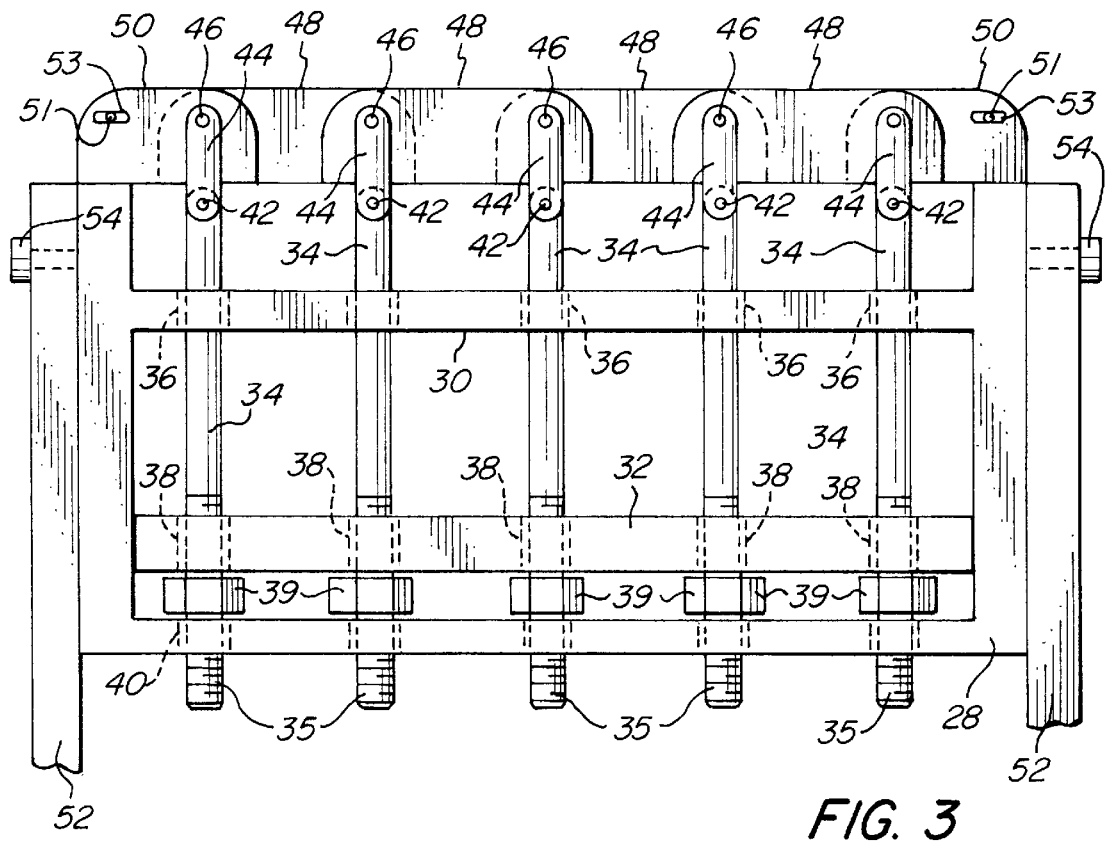

FIG. 3 generally illustrates an embodiment of the present invention. A frame 28 has an upper support 30 and a lower support 32. Upper support 30 has upper bores 36 therein. Lower support 32 has lower bores 38 therein. Push rods 34 are placed within the respective bores 36 and 38. The bores 36 and 38 have a diameter of sufficient size to permit push rods 34 to slide therein. One end of each of the push rods 34 is threaded and extends through frame bores 40 in frame 28. Placed between the lower support 32 and a portion of the frame 26 are placed nuts 39 threaded onto the threaded portion 35 of push rods 34. The other ends of push rods 34 are attached to a connecting link 44 by link pivot pins 42. The other end of connecting link 44 is attached to one end of a blade 48 by blade pivot pins 46. Therefore, one push rod 44 is coupled to each end of the blades 48 with the exception of end blades 50. End blades 50 have one end coupled to a push rod 44 and the other end coupled to frame 28 with end pivot pin 51. The end blades 50 may have slots 53 therein. The blades 48 are generally or substantially rectangular in shape, but have two corners with a radius. The radius is substantially equal to the distance between the pivot pin 46 and the edge of the blade 48. Extension supports 52 are attached so as to slide along the side of frame 28. The extension supports 52 may be attached to a rigid support structure, not shown. Set screws 54 are used to secure the sliding extension supports 52. The extension supports 52 are used to move or raise the entire frame 28, including the row of blades 48, in unison or all at once. This permits the row of blades 48 to be moved up or down into a predetermined position without individually moving the blades 48. This may be done for initial positioning or to quickly move the blades when a large adjustment is needed.

Figure 4:
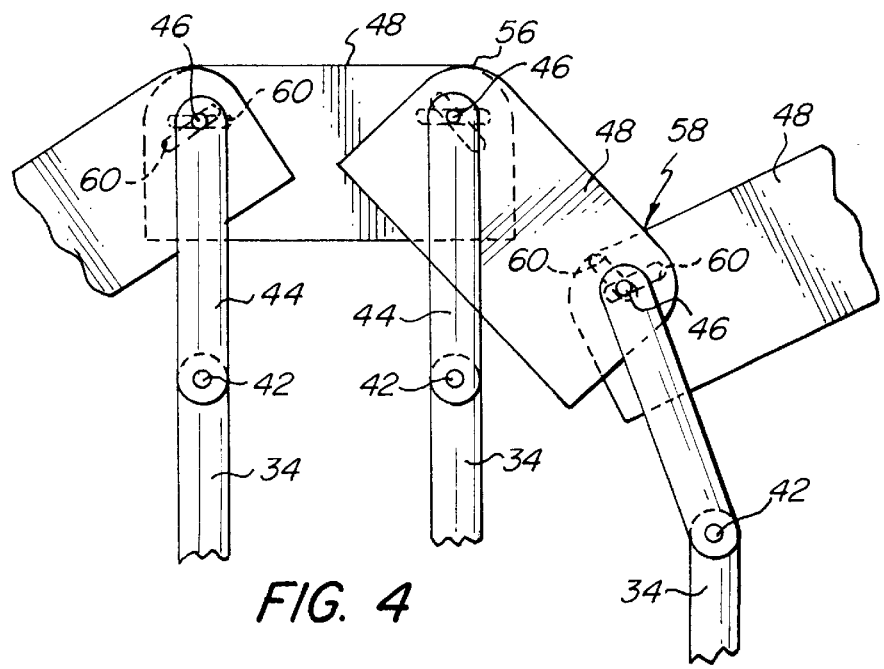

FIG. 4 more clearly illustrates a portion of the adjustable slit device including several of the blades 48 and their motion. Radius 56 on the corners of the blades 48 provide a smooth transition between adjacent blades 48. A saw tooth shape may also be formed at the intersection 58 of two blades 48. Additionally, one end of each blade 48 may have a slot 60 therein. The slot 60 may be positioned at every other blade pivot pin 46.

The operation of the device can readily be appreciated with reference to FIGS. 3 and 4. Adjustments to the illumination energy are made by moving push rods 34 which displace blades 48 selectively into the illumination energy or flux. Push rods 34 are independently adjusted by turning nuts 39. As the push rods 34 are caused to move up and down within the upper and lower supports 30 a nd 32 the respective blades are moved. Links 44 attached to the blades 48 provide lateral or sideways flexibility. The flexibility is needed due to the nominal differential sideways movement of the spacing between push rods 34 when the blades 48 are moved out of a straight line. Without this flexibility of sideways movement undue stress or stain may be placed on the push rods 34 or the blades 48. The slots 60 in blades 48 additionally help reduce any stress or strain due to the movement of blades 48. Slots 53 may also be placed in the ends 50. The flexibility may also be provided by attaching links 44 with a flexure rather than a pivot pin 42. Additionally, a flexure may be used rather than the rigid link 44 to provide sideways flexibility. If frictional forces are not adequate to securely hold the blades 48 in position, one end of the line of blades may be spring loaded so that a predetermined tension or bias is applied to the blades 48.

It should be appreciated that while the push rods 34 have been illustrated to be moved with a threaded portion and a nut any other suitable means or device for moving the push rods 34 is possible, such as other mechanical or electromechanical means well known to those skilled in the art. Additionally, other threaded or screw type push rods designs could be easily adapted to move the blades 48 in practicing the present invention. While the resolution of the adjustable slit device is only dependent on the number of individual blades 48 used, generally as few as approximately fifteen individual blades 48 have been used with much success.

Figures 5A, 5B:
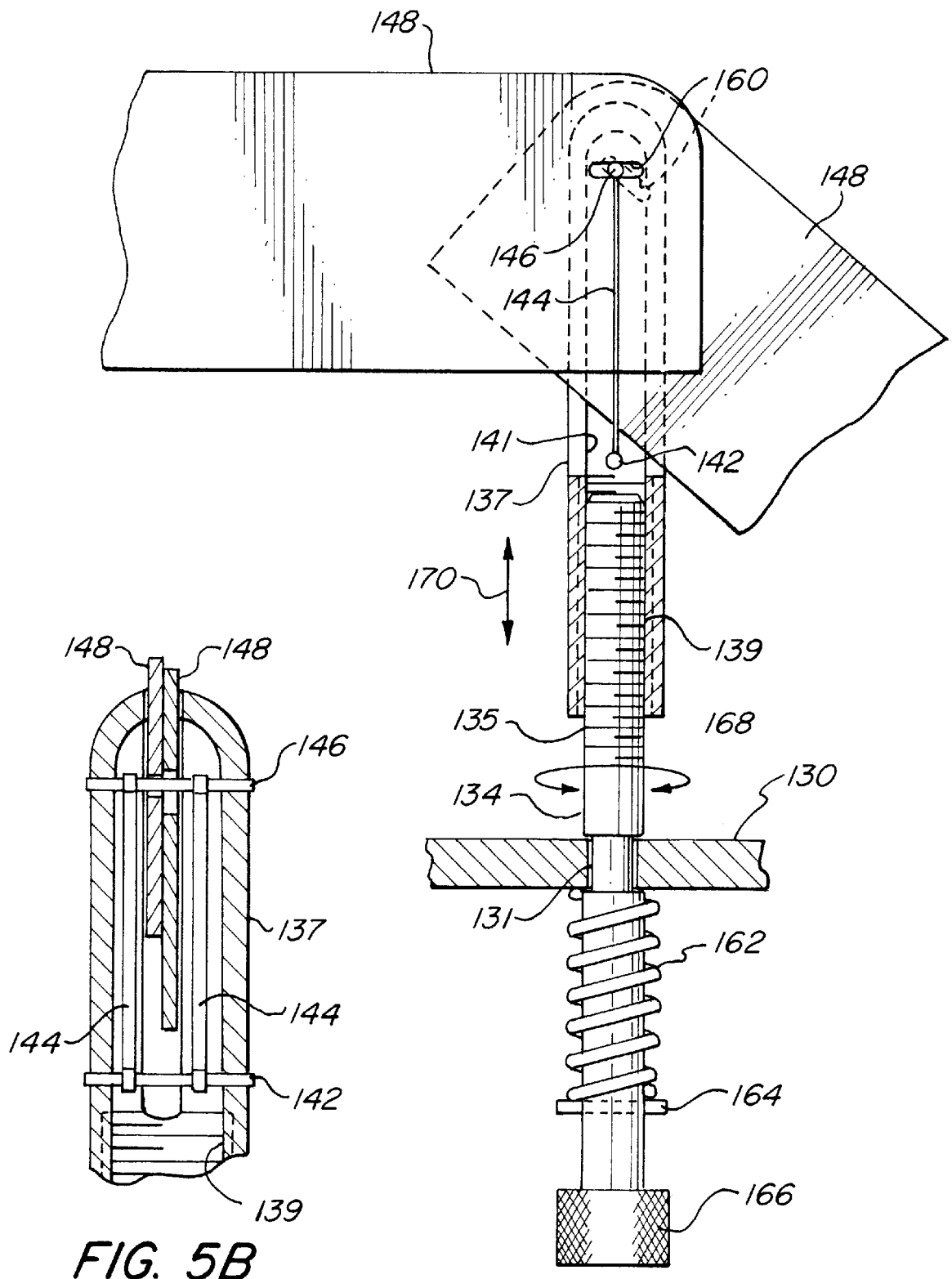
FIG. 5A is a partial cross section of a portion of an embodiment of the present invention.
FIG. 5B is a partial cross section of a portion of the invention illustrated in FIG. 5A rotated ninety degrees.

FIGS. 5A and 5B illustrate a partial cross section of another embodiment of the present invention. FIGS. 5A and 5B illustrate another construction for one of the push rods that may be used in practicing the present invention. It should be appreciated and understood that FIGS. 5A and 5B only illustrate one of the push rods in which there would be a number or a plurality of push rods with a number or plurality of blades similar to that illustrated in FIGS. 1 and FIG. 3. In FIGS. 5A and 5B, the blades 148 are pivotally connected together with a blade pivot pin 146. The pivot pin 146 extends through a push rod threaded extension 137. The push rod extension 137 is bifurcated so that the blades 148 can fit there between. The push rod extension 137 has a longitudinal bore 141 and internal threads 139 therein. The push rod 134 has external threads 135 thereon. The push rod 134 also has a reduced diameter 131 into which is positioned a support 130. The reduced diameter 131 prevents the push rod 134 from moving axially. Circumscribing the lower half of the push rod 130 is a helical spring 162. The helical spring 162 is confined at one end by the support 130 and at the other by a spring stop 164 attached to the push rod 134. On one end of the push rod 134 may be placed a knob 166. Placed within the longitudinal bore 141 of the push rod threaded extension 137 is at least one flexure 144. The flexure 144 is attached to the push rod extension 137 with a pin 146 placed through slots 160 in the blades 148. Slots 160 are elongated holes placed within the blades 148. Not all blades 148 need have elongated holes or slots 160. The other end of the flexure 144 is pinned to the push rod threaded extension 137 with pin 142. The flexure 144 provides a flexible link which permits lateral or sideways movement of the blades 148. Accordingly, the blades 148 are flexibly linked to the push rod threaded extension 137 which is threaded into the push rod 134. FIG. 5B is a partial crosssection illustrating another view of the push rod threaded extension 137 that is turned or rotated approximately ninety degrees from the view illustrated in FIG. 5A. In FIG. 5B, the flexures 144 are more clearly illustrated. FIG. 5B illustrates two flexures, one on each side of the blades 148. However, it should be appreciated that only one flexure is needed, although in some applications two may be preferable. The flexures 144 may also have a rectangular cross-section such that sideways or lateral movement of the row of blades is permitted and movement out of the plane of the row of blades is limited by the larger lengthwise dimension of the rectangular cross-section of the flexure 144.

The operation of the embodiment illustrated in FIGS. 5A and FIG. 5B should readily be appreciated. As knob 166 is turned such that the push rod 134 is rotated in either direction as indicated by arrow 168, the push rod threaded extension 137 is caused to move up and down in the direction illustrated by arrow 170. Accordingly, the ends of the blades 148 are caused to move up and down. Thereby, the blades 148 are inserted or removed from the illumination, illustrated generally as 10 in FIG. 1. Spring 162 places a slight tension on the external threads 135 and internal threads 139 which prevent any unintentional turning, as well as take up any play that may exist. When a plurality of push rods are used in a system with a plurality of blades 148 linked together, the moving up and down of the push rods 134 causes the blades 148 to move up and down, results in sideways or lateral forces being placed on the pins 146 attaching the blades 148 together. Much of these lateral or sideways forces are compensated for by the movement of flexure 144 laterally or sideways. The embodiment, illustrated in FIGS. 5A and 5B, is therefore similar to that illustrated in FIGS. 3 and 4. However, the rigid links 44, illustrated in FIGS. 3 and 4, are replaced with flexures 144. Both the link, 44 illustrated in FIGS. 3 and 4 and the flexure 144, illustrated in FIGS. 5A and 5B, are a type of link in that they both connect or couple the blades 48 and 148 to the push rods 34 and 134 to perform the same function or purpose in providing sideways or lateral movement as the plurality of blades 48 or 148 are moved into and out of the illumination, as illustrated in FIG. 1.

Figure 6:
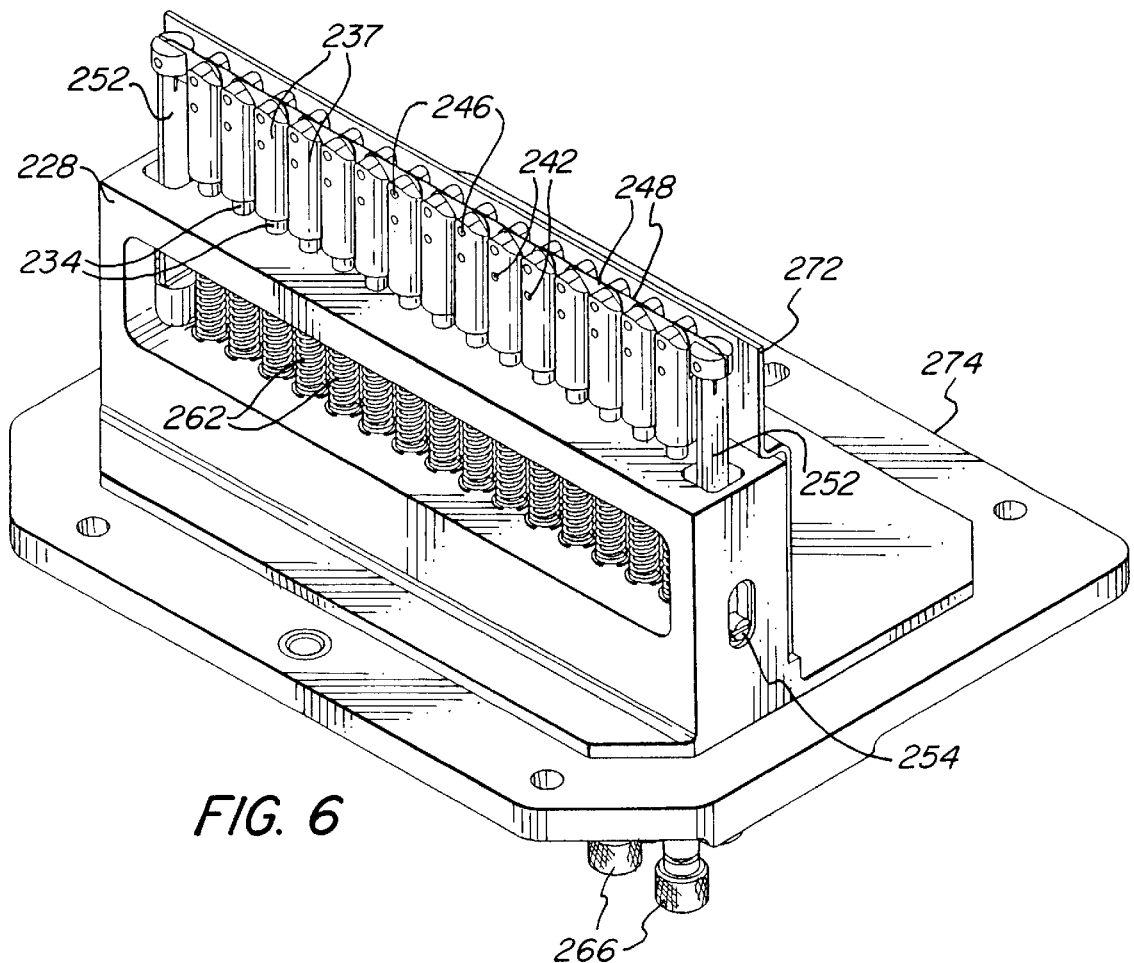
FIG. 6 is a perspective view of the present invention.

FIG. 6 is a perspective view illustrating the present invention in an assembled form that may be placed in a lithography tool. Frame 228 is attached onto a mount 274. A plurality of push rods 234, in this embodiment fifteen, are held in position by frame 228. Threaded onto one end of the plurality of push rods 234 are a plurality of push rod threaded extensions 237. Each push rod extension 234 is connected to two blades 248 by a blade pivot pin 246. The blade pivot pins 246 also attach one end of a link, not shown, to the push rod threaded extensions 237 and blades 248. The link may be a rigid link or a flexible link, such as a flexure. Link pivot pins 248 attach the other end of the link, not shown, to the push rod threaded extensions 246. The structure is very similar to that illustrated in FIGS. 5A and 5B. Each end of the row of linked blades 248 is attached to an extension support 252. Extension supports 252 slide within frame 228 and are locked into position with set screw 254. Extension supports 252 permit the row of linked blades 248 to be raised in a group. This facilitates initial positioning of the row of linked blades 248. Springs 262 are placed around each push rod 234. At the other end of the push rods 234 are placed knobs 266. The knobs 266 are used to individually turn the push rods 234 causing the respective blades 248 to move up and down, or into and out of a rectangular illumination field, not shown. A stationary shield 272 may be placed near the row of blades 248.

In some applications it may be desirable to provide a predetermined non-uniform exposure to a photosensitive resist covered substrate or wafer. For example this may be desired when features to be imaged on the photosensitive resist covered substrate have different line widths. These different line widths may be at different locations along the longitudinal lengths of the illumination field. Normally, it is desirable to keep the uniformity along the length of the rectangular illumination field constant. However, when a variety of different line widths are desired to be imaged it is advantageous to vary the exposure dose as a function of the line width. A constant line width to exposure dose ratio can be maintained to improve imaging and system performance. That is when a line width is relatively wide the exposure dose is increased at the corresponding longitudinal position in the illumination field, and when a line width is relatively narrow the exposure dose is decreased at the corresponding longitudinal position in the illumination field. The preferred or corrected exposure dose is independent of orientation of the feature, for example if the line is oriented in a vertical or horizontal direction. The increasing or decreasing of an exposure dose along the longitudinal length of an illumination field is easily accomplished with the device of the present invention. Simulations have indicated that such a method of correction will be independent of feature size and type over the range of linear response of a system. Additionally, bias between group and isolated features will not be affected.

Figure 7:
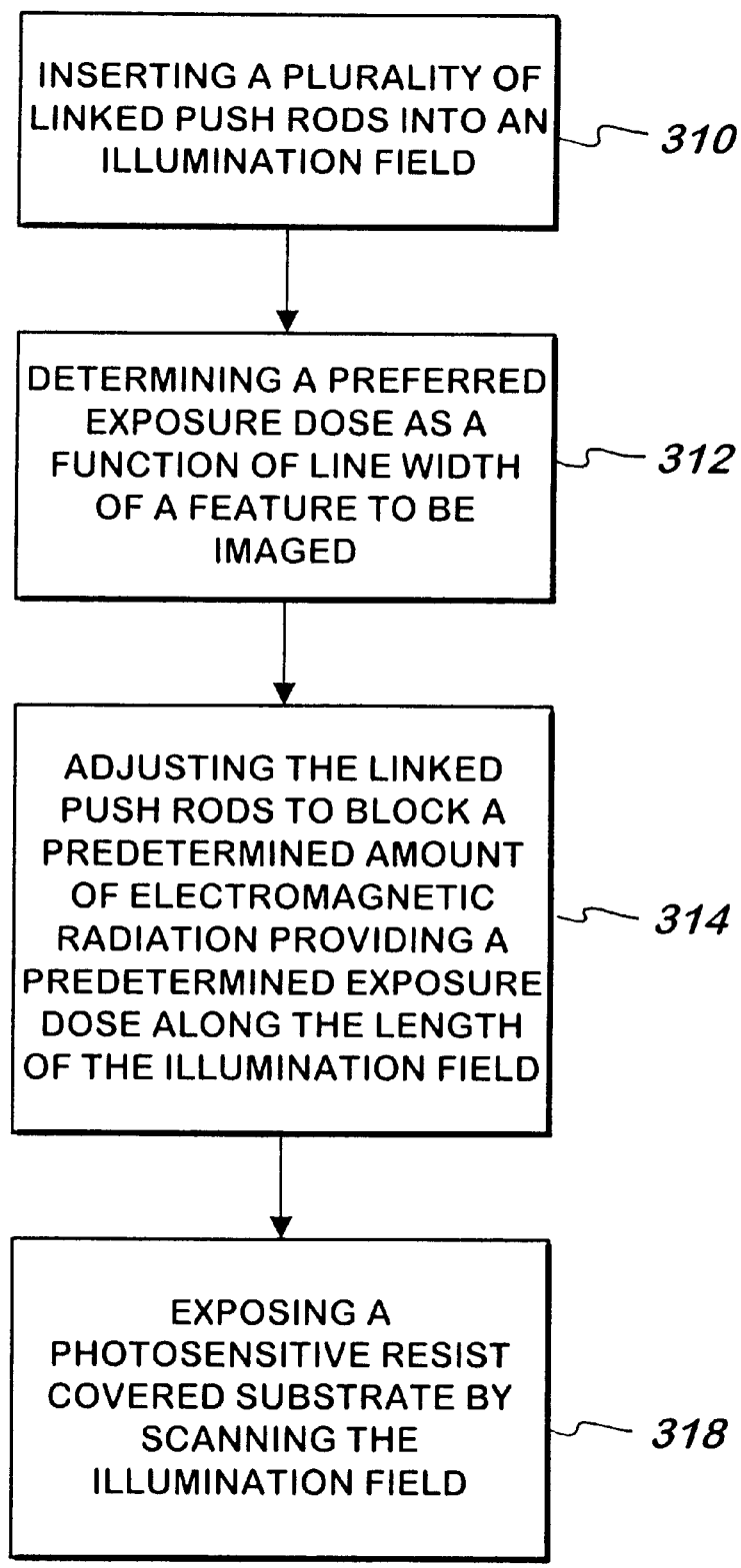
FIG. 7 is a block diagram illustrating the method steps of the present invention.

FIG. 7 is a block diagram illustrating a method of the present invention. Box 310 represents the method step of inserting a plurality of linked push rods into an illumination filed. The linked push rods may comprise a device as illustrated in FIGS. 3–6. Box 312 represents the method step of determining a preferred exposure dose as a function of line width of a feature to be imaged. The preferred exposure dose can easily be calculated based on well known techniques and may consider such variables as type of resist, substrate material, illumination energy, illumination wavelength, scanning speed, among others. The calculations may be performed by a computer, or obtained from a look-up table providing exposure dose as a function of line width. The preferred exposure dose may even be obtained by actual experimental results or a series of text exposures. Box 314 represents the step of adjusting the individual linked push rods to block a predetermined amount of electromagnetic readiation. This provides a predetermined exposure dose at predetermined positions along the length of the illumination field. Box 318 represents the step of exposing a photosensitive resist covered substrate by scanning the illumination field over the substrate. In practicing the method of the present invention the exposure dose along a longitudinal length of the illumination field is adjusted as a function of the line width of the pattern on the reticle at a corresponding location. As the line widths vary on the reticle corresponding locations along the illumination filed are adjusted to obtain a desired or optimized exposure dose. The adjustments in exposure dose may be made automatically by motors attached to the linked push rods. The adjustments in the exposure dose of the illumination field are made for each reticle used, and can be easily changed for each different reticle.

Accordingly, is should be appreciated that the present invention greatly facilitates the adjustment of a rectangular illumination field or slit and provides more uniform illumination energy that is particularly useful in a scanning lithography system. The linked set of blades provides smooth transitions greatly enhancing the ability to adjust the illumination energy for providing uniformity in exposure of a photosensitive resist covered substrate, such as a semiconductor wafer.

Although the preferred embodiments have been illustrated and described, it will be apparent to those skilled in the art that various modifications may be made without departing from the spirit and scope of this invention as set forth in the claims.

What is claimed is:

1. A device for adjusting illumination energy in a rectangular illumination field used in lithography to expose a photosensitive substrate comprising:

a frame;

a plurality of blades linked together forming a longitudinal edge of the rectangular illumination field and held by said frame;

a plurality of push rods coupled to linked pairs of said plurality of blades, each of said plurality of push rods independently moving the linked pairs of said plurality of blades, whereby the illumination energy received by the photosensitive substrate is modified along the longitudinal length of the rectangular illumination field.

2. A device for adjusting illumination energy in a rectangular illumination field as in claim 1 further comprising:

an extension support attached to each end of the longitudinal edge formed by said plurality of blades and adjustable held by said frame, whereby said plurality of blades may be moved in a group.

3. A device for adjusting illumination energy as in claim 1 further comprising:

a link placed between each of said plurality of blades and each of said plurality of push rods.

4. A device for adjusting illumination energy as in claim 3 wherein:

said link is a rigid link.

5. A device for adjusting illumination energy as in claim 3 wherein:

said link is a flexure.

6. A device for adjusting illumination energy as in claim 1 wherein:

said plurality of push rods includes at least eight push rods.

7. A device for adjusting illumination energy as in claim 1 further comprising:

an extension support attached to said frame, said extension support permitting said frame to slide moving said plurality of blades together as a group.

8. A device for adjusting illumination energy as in claim 1 wherein:

each of said plurality of blades has a slot in one end where they are pivotally linked together.

9. A device for adjusting illumination energy in an illumination field for use in lithography comprising:

a plurality of blades, each of said plurality of blades having a first end and a second end, said plurality of blades being pivotally linked together at the first and second ends;

a plurality of links, one each of said plurality of links attached to two of said plurality of blades; and a plurality of push rods, one each of said plurality of push rods attached to the one each of said plurality of links, whereby when said plurality of push rods are moved respective blades of said plurality of blades move adjusting the illumination energy in the illumination field.

10. A device for adjusting illumination energy as in claim 9 wherein:

said plurality of links are rigid.

11. A device for adjusting illumination energy as in claim 9 wherein:

said plurality of links are flexures.

12. A device for adjusting illumination energy as in claim 9 wherein:

one end of each of said plurality of push rods is threaded.

13. A device for adjusting an illumination energy in a rectangular illumination field used in lithography comprising:

a plurality of rectangular blades forming an edge placed adjacent the illumination energy;

a plurality of push rod assemblies attached to said plurality of rectangular blades, each of said plurality of push rod assemblies including, a push rod extension having a longitudinal bore;

a flexure having a first and second end placed within the longitudinal bore of said push rod extension;

a first pin extending into said push rod extension and pivotally attaching two of said plurality of blades and the first end of said flexure together;

a second pin extending into said push rod extension and attaching to the second end of said flexure; and a push rod coupled with threads to said push rod extension;

whereby when said push rod is rotated two of said plurality of rectangular blades are moved into and out of the illumination energy in a predetermined way to adjust the illumination energy of the illumination field.

14. A device for adjusting an illumination energy as in claim 13 further comprising:

a support holding said push rod.

15. A device for adjusting an illumination energy as in claim 14 further comprising:

a spring stop placed on said push rod; and a spring placed between said support and said spring stop.

16. A device for adjusting an illumination energy as in claim 15 further comprising:

a knob placed on one end of said push rod.

17. A device for adjusting an illumination energy as in claim 13 wherein:

two corners of each of said plurality of substantially rectangular blades have a rounded edge defined by a radius.

18. A device for adjusting an illumination energy as in claim 17 wherein:

the radius is equal to a distance from the rounded edge to the first pin.

19. A method of adjusting an elongated illumination field for providing a predetermined exposure dose of electromagnetic radiation to a photosensitive resist covered substrate comprising the steps of:

determining a location and width of a plurality of different line widths along a length of a reticle;

determining an exposure dose as a function of the plurality of different line widths at corresponding locations along the length of the reticle;

adjusting the illumination field at the corresponding locations to the exposure dose, whereby the predetermined exposure dose is obtained optimizing overall exposure as a function of the location and width of the plurality of different line widths improving system performance.

* * * * *